United States Patent [19]

Christensen

[11] Patent Number: 4,990,829
[45] Date of Patent: Feb. 5, 1991

[54] HIGH FREQUENCY DISCHARGE APPARATUS WITH HOLLOW WAVEGUIDE INPUT SECTION

[75] Inventor: C. Paul Christensen, Greenbelt, Md.

[73] Assignee: Potomac Photonics, Inc., Lanham, Md.

[21] Appl. No.: 341,384

[22] Filed: Apr. 21, 1989

[51] Int. Cl.⁵ .................. H01J 7/46; H01J 19/80; H05B 31/26
[52] U.S. Cl. .................. 315/39; 315/111.41; 315/248; 333/99 PL; 328/216
[58] Field of Search .......... 315/39, 111.21, 111.41, 315/111.81, 111.91, 248; 333/99 PL, 35, 33; 328/216

[56] References Cited

U.S. PATENT DOCUMENTS

| | | | |
|---|---|---|---|
| 3,157,823 | 11/1964 | Clapp | 315/39 |
| 4,458,222 | 7/1984 | Herstein et al. | 333/35 |
| 4,631,732 | 12/1986 | Christensen | 372/64 |
| 4,789,809 | 12/1988 | Christensen | 315/111.41 |
| 4,792,732 | 12/1988 | O'Loughlin | 315/39 |

Primary Examiner—Eugene R. Laroche
Assistant Examiner—Michael B. Shingleton
Attorney, Agent, or Firm—Wegner, Cantor, Mueller & Player

[57] ABSTRACT

A high-power, high-frequency discharge apparatus is disclosed. An electrical wave is guided toward the discharge region by a hollow waveguide that is coupled to a discharge electrode via a waveguide transition element. The waveguide transition element can be formed of various shapes. Obstacles placed in the waveguide provide impedance matching and minimize power reflected back toward the source. The obstacles may be movable to optimize impedance matching.

16 Claims, 2 Drawing Sheets 4,990,829

HIGH FREQUENCY DISCHARGE APPARATUS WITH HOLLOW WAVEGUIDE INPUT SECTION

BACKGROUND OF THE INVENTION

A gas discharge device excited with high frequency (200 MHz to 10 GHz) electromagnetic fields for use, for example, in excitation of lasers for chemical processing of solid surfaces, is shown in U.S. Pat. No. 4,789,809 to Christensen (commonly assigned herewith), the disclosure of which is incorporated herein by reference. The device disclosed by Christensen uses a high-frequency electric field to excite a gaseous plasma between an electrically conducting electrode and a ground plane. The electrode is conductively or capacitively connected to a conductor that is positioned over the same ground plane to form a transmission line for delivery of high frequency power from the generator to the discharge. Impedance matching is accomplished by positioning two quarter wavelength slugs between the transmission line conductor and the ground plane to decrease the characteristic impedance in their vicinity. When applying low frequency voltages (0-50 MHz), a thin sheet of dielectric can be placed between the discharge electrode and the transmission line conductor.

This device has the disadvantage that the microstrip waveguide configuration used in the device is not capable of withstanding relatively high microwave power levels (on the order of a few hundred kilowatts or higher). The tuning slugs described in the aforementioned patent also are not capable of withstanding these higher microwave power levels without the formation of spurious discharges. There is also no provision for connecting the device to a hollow waveguide.

SUMMARY OF THE INVENTION

The present invention overcomes the above difficulties by providing a hollow waveguide capable of withstanding higher microwave power levels. A transition element provides a means for transporting microwave power from the hollow waveguide to the discharge electrode. Obstacles, typically in the form of metal or dielectric sheets, reduce the total power reflected towards the microwave source. The obstacles may be mounted for movement for optimization of impedance matching.

BRIEF DESCRIPTION OF THE DRAWINGS

FIG. 1b is a top view in section of the apparatus shown in FIG. 1a;

FIG. 2b is a top view in section of the apparatus shown in FIG. 2a;

FIG. 2c is an end elevational view in section of the apparatus shown in FIG. 2a;

DETAILED DESCRIPTION OF THE PREFERRED EMBODIMENTS

Figure 1A:
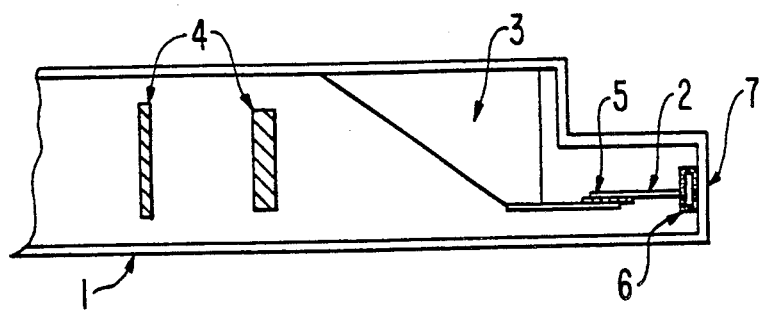
FIG. 1a is a side elevational view in section of a high-frequency excitation apparatus in accordance with a first preferred embodiment of the invention.
Figure 1B:
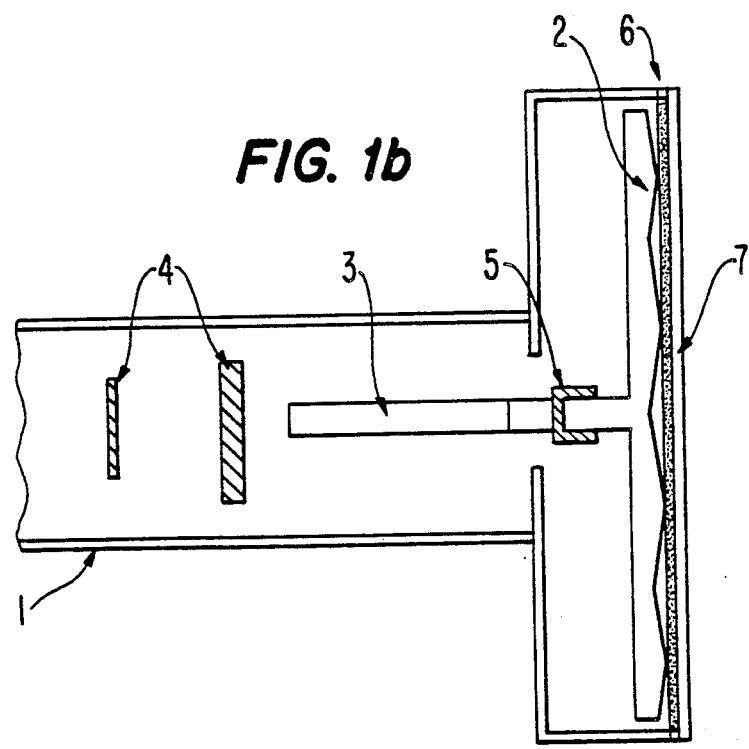

FIGS. 1a and 1b illustrate a first preferred embodiment in accordance with the invention. Throughout the figures, like numerals are used to indicate like elements. During operation, a high-power, high-frequency (200 MHz to 10 GHz) electrical wave is guided toward the discharge region by the hollow waveguide 1 that is coupled to the discharge electrode 2 via waveguide transition element 3. Use of the hollow waveguide 1 improves performance of this microwave system since many high-power microwave sources are designed for ease of connection to hollow waveguide structures. Further, hollow waveguide structures are capable of withstanding higher microwave power levels than a microstrip waveguide configuration.

Figure 2A:
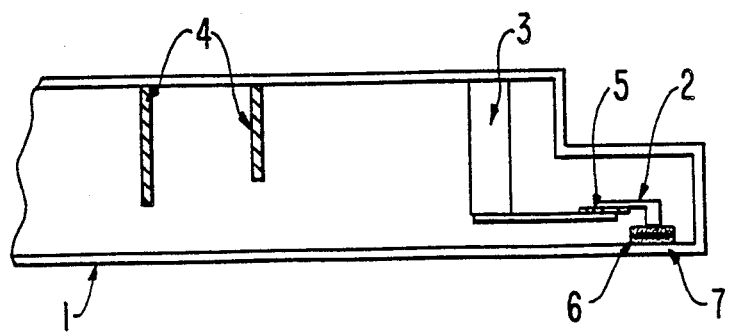
FIG. 2a is a side elevational view in section of a high-frequency excitation apparatus in accordance with a further preferred embodiment of the invention, showing a different waveguide transition element and different impedance matching obstacles.
Figure 2B:
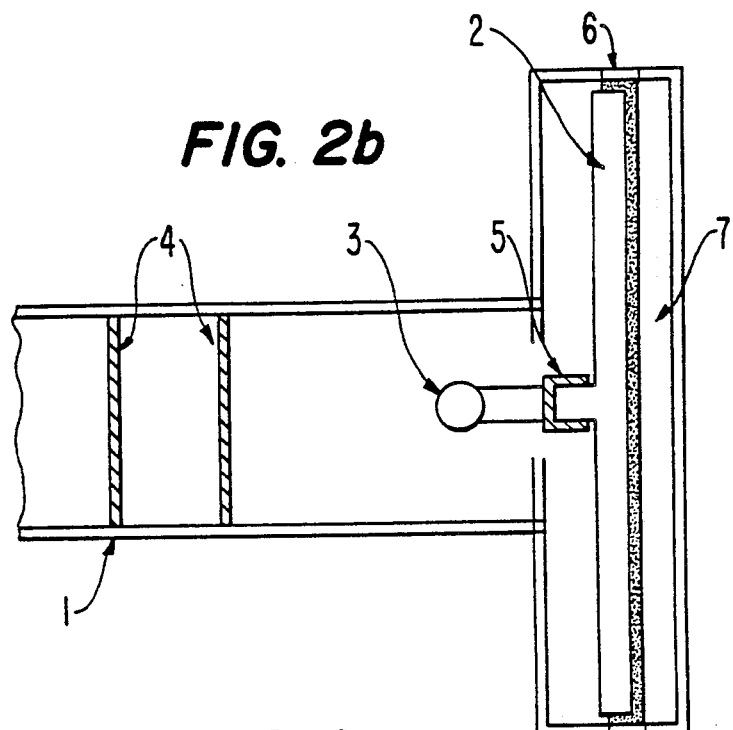
Figure 2C:
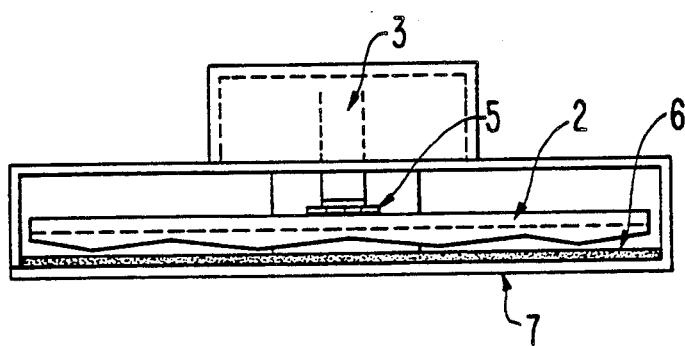

In this first preferred embodiment shown in FIGS. 1a and 1b, waveguide transition element 3 for transferring the high-frequency electromagnetic fields to the discharge electrode is a fin-shaped structure. Alternatively, the waveguide transition element may be formed by a cylindrical post, as shown in FIGS. 2a-2c, or any other suitable shape. A suitable shape is one that provides the desired impedance matching, but does not have any sharp edges that might induce spurious discharges.

As is well known in the art of microwave engineering, conducting or non-conducting obstacles may be inserted into the hollow waveguide to improve impedance matching and minimize power reflected by the discharge structure back toward the high-frequency source. See, for example, T. S. Saas, ed., "Microwave Designer's Handbook, Vol. 1", Artech House, Inc., Dedham, Mass., 1971. The invention uses obstacles 4 that are capable of withstanding high microwave power levels. Obstacles 4 are preferably in the form of metal or dielectric sheets positioned so as to reduce the cross-sectional dimensions of the waveguide. A thin layer of dielectric material 5 may also be used to electrically isolate the discharge electrode from the hollow waveguide structure at low frequencies (0 to 50 MHz).

As shown in FIGS. 1a and 1b, obstacles 4 need not be attached to the waveguide walls. The obstacles can be mounted on positioning devices, such as a threaded rod 9 connected to a thumbwheel 10 that protrudes through the wall of the waveguide to allow the obstacles to be moved to optimize impedance matching. Of course, other types of positioning mechanisms may also be used, as would be apparent to those skilled in the art.

Uniform excitation of the discharge plasma along the length of the discharge tube 6 requires that the electric field in the region occupied by the discharge tube also be relatively uniform. The electric field at any point along the length of electrode 2 is proportional to the voltage on the electrode at that point and approximately inversely proportional to the separation between the electrode 2 and the ground plane 7. If the length of the electrode is greater than approximately ⅛ of the wavelength of the applied electric field, standing wave effect are likely to cause variation of the local electrode voltage along the length of the electrode. This voltage variation will result in nonuniform excitation of the plasma if the separation between the electrode 2 and the ground plane 7 is constant. However, by shaping the electrode 2 so that the separation between the electrode and the ground plane increases in regions where the local electrode voltage is high and decreases in regions where the electrode voltage is low, power deposition into the plasma can be maintained at a relatively uniform level along the portion of the discharge tube 6 lying between the electrode 2 and the ground plane 7. The voltage variation is first measured, and then the electrode 2 is shaped to compensate for the variation due to the standing wave. The distance from the electrode 2 to the tube 6 is therefore proportional to the voltage.

It is well known in the art that application of a high-voltage pulse to the discharge electrode prior to excitation by high-frequency fields effects preionization of the gas and assures effective delivery of the high-frequency electrical power to the discharge plasma. This pulse may be applied by means of a conductor bonded or otherwise attached to the electrode 2. Since the high-voltage preionization pulse can damage the high-frequency generator and associated circuitry, and the high-frequency circuitry can interfere with proper delivery of the high-voltage pulse to the electrode, it is desirable to electrically isolate the high-frequency portion of the excitation system from the electrode by inserting a suitable capacitor between the electrode 2 and the waveguide transition element 3. An appropriate capacitor can be formed by placing a dielectric sheet 5 between the electrode 2 and waveguide transition element 3. The dielectric material 5 should exhibit low loss at the excitation frequency utilized and sufficient dielectric strength and thickness to withstand the electric fields produced by the discharge preionization pulses.

Figure 3:
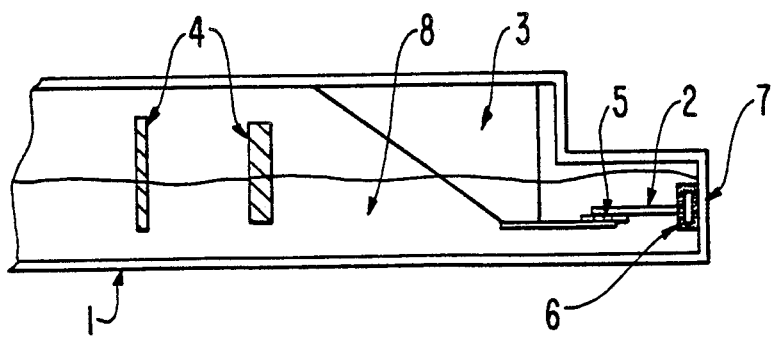
FIG. 3 is a side elevational view in section of a high-frequency excitation apparatus in accordance with a further preferred embodiment of the invention.

As shown in FIG. 3, all or part of the discharge apparatus may be immersed in a nonconducting fluid 8 to suppress unwanted electrical breakdown in regions of high electric field or to increase the rate of heat removal from the region near the discharge tube.

This description is for illustrative purposes only. Modifications can be made within the scope of the invention as defined by the appended claims.

I claim:

1. A high-power, high-frequency microwave discharge apparatus, having a power level of at least a few hundred kilowatts and which is excited with an electromagnetic field of at least two hundred megahertz, comprising:
   a ground plane;
   a discharge electrode having a longitudinal axis parallel to said ground plane;
   a dielectric discharge tube positioned between said electrode and said ground plane;
   a hollow waveguide for guiding the high-power, high-frequency electrical wave from a source toward said discharge electrode;
   waveguide transition means coupled to said discharge electrode for transferring said high-frequency electromagnetic fields propagating in said hollow waveguide to said discharge electrode; and
   at least one obstacle in said hollow waveguide.

2. An apparatus as in claim 1, wherein a microwave electric field is produced between said electrode and said ground plane by an electric voltage, and said dielectric discharge tube is spaced from said electrode a distance proportional to the electrode voltage.

3. The apparatus as in claim 1, wherein microwave power is capacitively coupled from said waveguide transition means to said electrode without direct electrical contact between said electrode and said transition means.

4. The apparatus as in claim 3, further comprising a dielectric sheet inserted between said discharge electrode and said waveguide transition means to create a capacitive coupling.

5. The apparatus as in claim 3, further comprising means for applying low frequency voltages to said discharge electrode at frequencies substantially lower than the microwave frequency.

6. The apparatus as in claim 1, wherein said at least one obstacle is made of electrically conducting material.

7. The apparatus as in claim 1, wherein said discharge tube is immersed in a nonconducting fluid.

8. The apparatus as in claim 1, wherein said discharge electrode is immersed in a nonconducting fluid.

9. The apparatus as in claim 1, wherein at least a portion of said hollow waveguide is filled with a nonconducting fluid.

10. The apparatus as in claim 1, wherein a microwave electric field is produced between the electrode and the ground plane, and said discharge electrode has an edge, the shape of which is determined so as to increase uniformity of the microwave electric field produced between said discharge electrode and said ground plane.

11. The apparatus as in claim 10, wherein microwave power is capacitively coupled from said waveguide transition means to said electrode without direct electrical contact between said electrode and said transition means.

12. The apparatus as in claim 11, further comprising a dielectric sheet inserted between said discharge electrode and said waveguide transition means to create a capacitive coupling.

13. The apparatus as in claim 10, further comprising means for applying a low frequency voltage to said discharge electrode at frequencies substantially lower than the microwave frequency.

14. The apparatus as in claim 10, wherein said at least one obstacle is constructed to include electrically conducting material.

15. The apparatus as in claim 11, wherein at least a portion of said hollow waveguide is immersed in a nonconducting fluid.

16. The apparatus as in claim 1, wherein said at least one obstacle is movable.